United States Patent
Hossain et al.

(10) Patent No.: US 6,919,598 B2
(45) Date of Patent: Jul. 19, 2005

(54) LDMOS TRANSISTOR WITH ENHANCED TERMINATION REGION FOR HIGH BREAKDOWN VOLTAGE WITH LOW ON-RESISTANCE

(76) Inventors: Zia Hossain, 7472 S. Hazelton La., Tempe, AZ (US) 85283; Mohamed Imam, 442 W. El Freda Rd., Tempe, AZ (US) 85284; Joe Fulton, 1641 E. Shannon St., Chandler, AZ (US) 85225

(*) Notice: Subject to any disclaimer, the term of this patent is extended or adjusted under 35 U.S.C. 154(b) by 23 days.

(21) Appl. No.: 10/384,144

(22) Filed: Mar. 10, 2003

(65) Prior Publication Data

US 2004/0178443 A1 Sep. 16, 2004

(51) Int. Cl.[7] ............................................. H01L 29/76
(52) U.S. Cl. ...................... 257/328; 257/287; 257/336; 257/341; 257/342; 257/343; 257/339; 257/409; 257/496
(58) Field of Search .................................. 257/328, 287, 257/336, 341, 342, 343, 339, 409, 496

(56) References Cited

U.S. PATENT DOCUMENTS

| | | | |
|---|---|---|---|
| 5,258,636 A | * | 11/1993 | Rumennik et al. .......... 257/339 |
| 5,633,521 A | * | 5/1997 | Koishikawa ................. 257/336 |

* cited by examiner

Primary Examiner—Minhloan Tran
Assistant Examiner—Tan Tran
(74) Attorney, Agent, or Firm—Kevin B. Jackson

(57) ABSTRACT

A structure for making a LDMOS transistor (100) includes an interdigitated source finger (26) and a drain finger (21) on a substrate (15). Termination regions (35, 37) are formed at the tips of the source finger and drain finger. A drain (45) of a second conductivity type is formed in the substrate of a first conductivity type. A field reduction region (7) of a second conductivity type is formed in the drain and is wrapped around the termination regions for controlling the depletion at the tip and providing higher voltage breakdown of the transistor.

17 Claims, 5 Drawing Sheets

LDMOS TRANSISTOR WITH ENHANCED TERMINATION REGION FOR HIGH BREAKDOWN VOLTAGE WITH LOW ON-RESISTANCE

BACKGROUND OF THE INVENTION

The present invention relates in general to semiconductor devices and more specifically to high voltage lateral-diffused-metal-oxide-semiconductor (LDMOS) transistors.

Many applications use switching transistors in their power supplies in order to increase efficiency. These applications often require that the switching transistors withstand high breakdown voltages and operate at a low on-resistance. LDMOS transistors are used in these applications, because they can operate with a high efficiency and their planar structure allows for easy integration on a semiconductor die with other circuitry.

To improve capacity, power-switching transistors typically are formed with multiple interdigitated source and drain regions connected in parallel. To avoid routing high voltage metal over an underlying low voltage semiconductor region, the multiple drain regions are extended to form a common region for disposing a drain-bonding pad. As a result, the surface topography of a LDMOS transistor is typically configured using interdigitated source fingers and drain fingers with tips at the ends of the fingers.

One problem that limits the breakdown voltage of the LDMOS transistor is the concentration of the electric field at the tip of both the source fingers and the drain fingers. Rounding the source and drain tips are used to reduce the concentration of the electric field.

However, rounding the source and drain tips are not adequate at a higher voltage or when a smaller tip is needed, because a higher voltage or a smaller tip further increases the concentration of the electric field at the tip. Previous transistors use rounded tips with a relatively large radius to reduce these electric fields. However, the large radius increases the die size and manufacturing cost of the device, while reducing the radius reduces the breakdown voltage.

Hence, there is a need for a LDMOS transistor that can withstand higher breakdown voltages without increasing the die size and manufacturing cost of the transistor.

DETAILED DESCRIPTION OF THE DRAWINGS

In the figures, elements having the same reference numbers have similar functionality.

Figure 1:
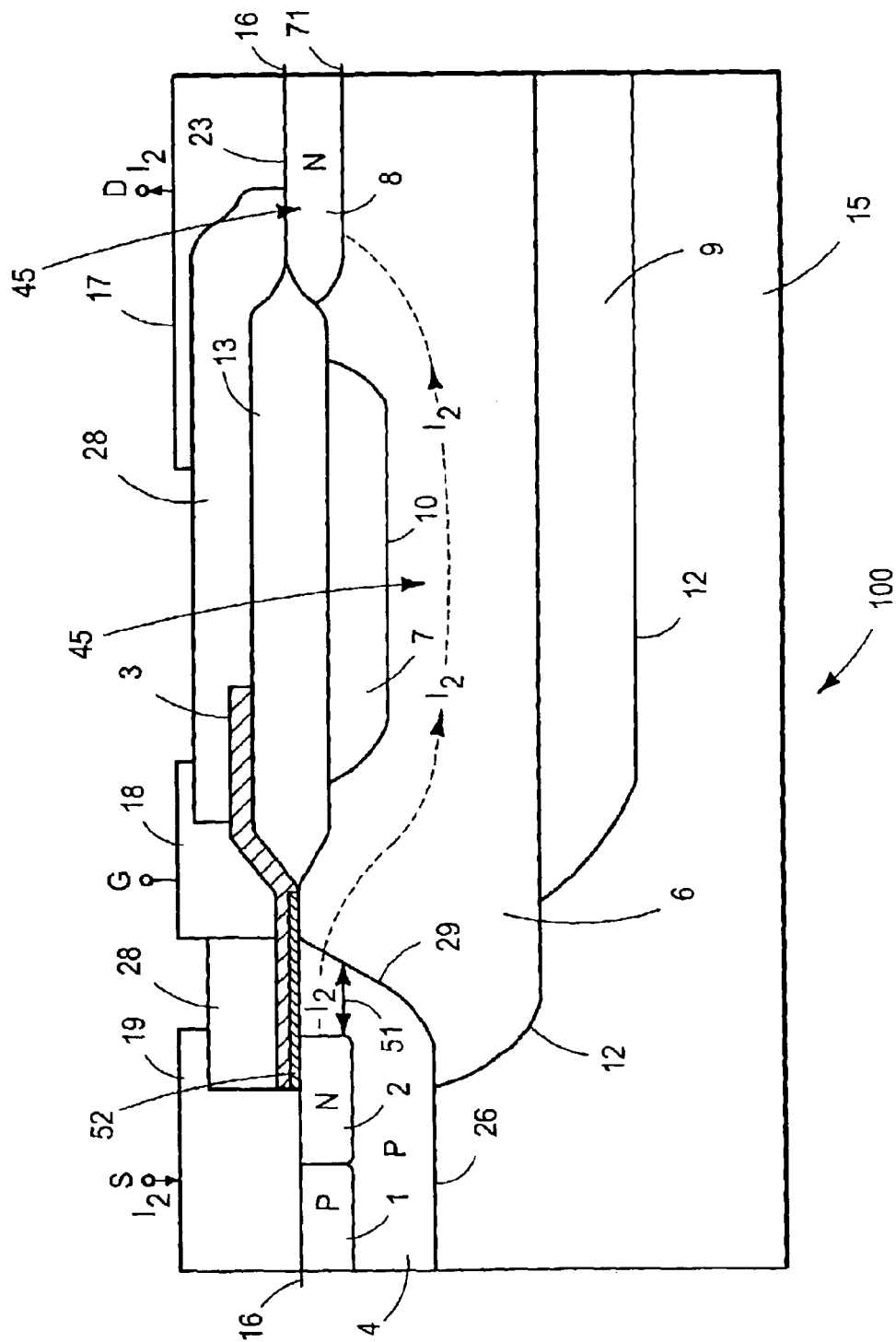
FIG. 1 is a cross-sectional view of a transistor.

FIG. 1 shows a cross-sectional view of a lateral-diffused-metal-oxide-semiconductor (LDMOS) power transistor 100 formed on a semiconductor substrate 15 for use in a switching regulator. Transistor 100 includes a source region 2 and a drain region 45 for electrically coupling to a channel section 51 for conducting a current $I_2$. Source region 2, drain region 45 and channel section 51 are all formed at a surface 16 of substrate 15 to facilitate the addition of other circuitry (not shown) in order to form an integrated circuit that contains transistor 100. In one embodiment, transistor 100 operates with a drain to source and drain to gate breakdown voltage of more than seven hundred volts.

Semiconductor substrate 15 has p-type conductivity and a high resistivity. In one embodiment, semiconductor substrate 15 is lightly doped to provide a high breakdown voltage with a doping concentration in a range of about $1.0*10^{14}$ to $2.0*10^{14}$ atoms/centimeter$^3$.

An implanted high voltage p-well region 4 is formed in substrate 15 to form channel section 51 at surface 16. The p-type dopants increase the conduction threshold of channel section 51 in order to increase noise immunity and prevent false triggering of transistor 100. P-well region 4 provides an additional benefit of reducing device susceptibility to high voltage punch-through between drain region 45 and source region 2. In one embodiment, p-well region 4 is doped with a surface concentration of about $1.5*10^{17}$ atoms/centimeter$^3$ and formed to a depth of about 2.5 micrometers below surface 16.

A contact region 1 is formed within p-well region 4 and is highly doped with the same conductivity type to provide an ohmic contact to the p-well region 4. In one embodiment, the contact region 1 has a surface concentration of about $5.0*10^{18}$ atoms/centimeters$^3$ and a depth of about 0.8 micrometers below surface 16. Contact region 1 reduces the susceptibility of transistor 100 to parasitic bipolar effects.

A source region 2 is formed within p-well region 4 to make electrical contact to channel section 51. In one embodiment, source region 2 is implanted with n-type dopants to have a concentration of about $1.0*10^{20}$ atoms/centimeter$^3$ and is formed to a depth of about 0.8 micron below surface 16.

Drain region 45 includes a first drain portion 6, a second drain portion 9 and a region 8 for making electrical contact to drain region 45. First drain portion 6 is lightly doped and forms a junction 12 with substrate 15, and a junction 29 with the p-well region 4. In one embodiment, the first drain portion 6 has a depth of about six micrometers below the surface 16 and is doped to about a $3*10^{15}$ atoms/cm$^3$.

The second drain portion 9 is heavily doped and is formed within the first drain portion 6. The heavy doping of second drain portion 9 improves the current carrying capability by keeping the on-resistance low. A junction 12 forms between the first 6 and second 9 drain portions and the substrate 15. In one embodiment, second drain portion 9 is formed about ten micrometers further from the channel section 51 than the first drain portion 6. This offset leaves the part of the first drain portion 6 that extends laterally from second drain portion 9, i.e., closer to the channel section 51, lightly doped to avoid a premature breakdown near the surface 16 in the vicinity of the channel section 51. In one embodiment, the second drain portion 9 has a depth of about nine micrometers below the surface 16 of the substrate 15 and is doped to about a $1*10^{16}$ atoms/cm$^3$.

Region 8 is formed within the first 6 and second 9 drain portions and is heavily doped to about $1*10^{20}$ atoms/cm$^3$. Region 8 provides an ohmic contact for externally coupling a drain current via a drain contact 71 to drain region 45.

A field reduction region, or p-top region 7, is formed at surface 16 within the drain region 45. The p-top region 7 is doped with a p-type conductivity to form a junction 10 with the first 6 and second 9 drain portions. The depth of p-top region 7 is less than the depth of the first 6 and second 9 drain portions. In one embodiment, the p-top region 7 is formed in the first 6 and second 9 drain portions to a depth of about two micrometers below the surface 16 and is doped to about a $3*10^{16}$ atoms/cm$^3$. The location of the p-top region 7 relative to the second drain portion 9 changes the on-resistance and breakdown voltage of the transistor 100. For example, it can be shown that forming the p-top region 7 further away from the channel section 51 will decrease the on-resistance and breakdown voltage, or forming the p-top region 7 nearer to the channel section 51 will increase the on-resistance and breakdown voltage. In one embodiment, the second drain portion 9 is laterally offset about three micrometers closer to the channel section 51 than the p-top region 7.

A dielectric layer 13 is formed over the first 6 and second 9 drain portions and p-top region 7 to a thickness, in one embodiment, of about 1.2 micrometers. In one embodiment, dielectric layer 13 comprises a thermally grown silicon dioxide. In another embodiment, dielectric layer 13 may be formed using a deposited oxide.

A gate dielectric layer 52 is formed over channel section 51. In one embodiment, gate dielectric layer 52 is made of silicon dioxide grown over surface 16 to a thickness of about 600 angstroms.

A gate 3 is formed over the gate dielectric layer 52 to function as a control electrode that varies the conductivity of channel section 51 within the p-well region 4. In one embodiment, gate 3 is made of polycrystalline silicon. Note that gate 3 extends over a portion of the dielectric layer 13 to redistribute the electric field.

An interlayer dielectric region 28 (ILD) covers a portion of gate 3, gate dielectric layer 52, dielectric layer 13 and region 8 as shown. Portions of the ILD 28 are opened during processing to provide for electrically contacting source electrode 19, gate electrode 18 and drain electrode 17. In one embodiment, ILD 28 comprises silicon dioxide deposited to a thickness of about thirteen thousand angstroms. Also, the ILD 28 provides protection for the transistor 100.

A standard metallization layer is disposed over surface 16 to form a source electrode 19 coupled to source region 2, a gate electrode 18 coupled to gate 3, and a drain electrode 17 coupled to region 8 of drain region 45. Source electrode 19 electrically connects regions 1 and 2 to maintain them at the same potential. In one embodiment, source electrode 19 is biased at ground potential.

Figure 2:
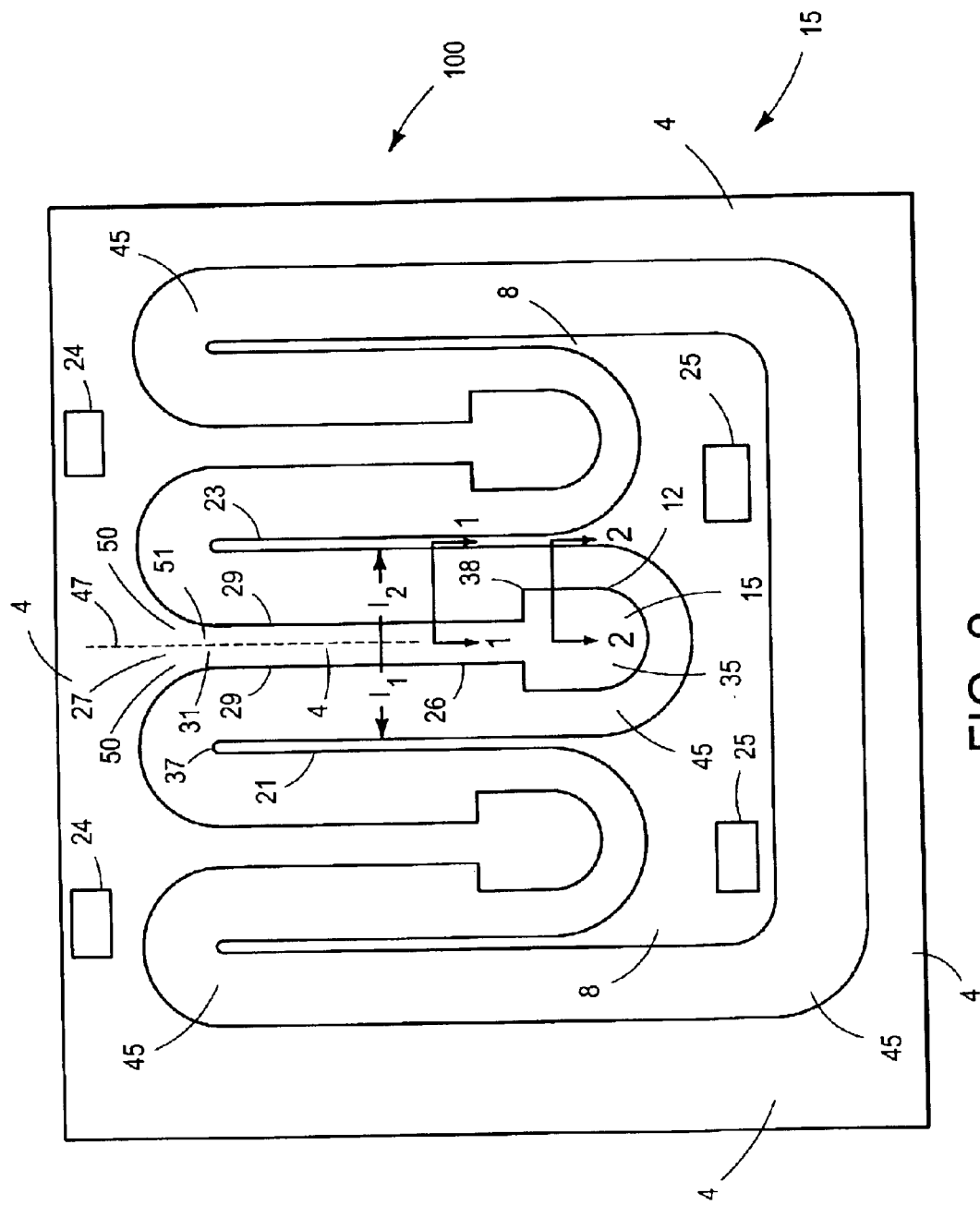
FIG. 2 is a top-view of the transistor.
Figure 3:
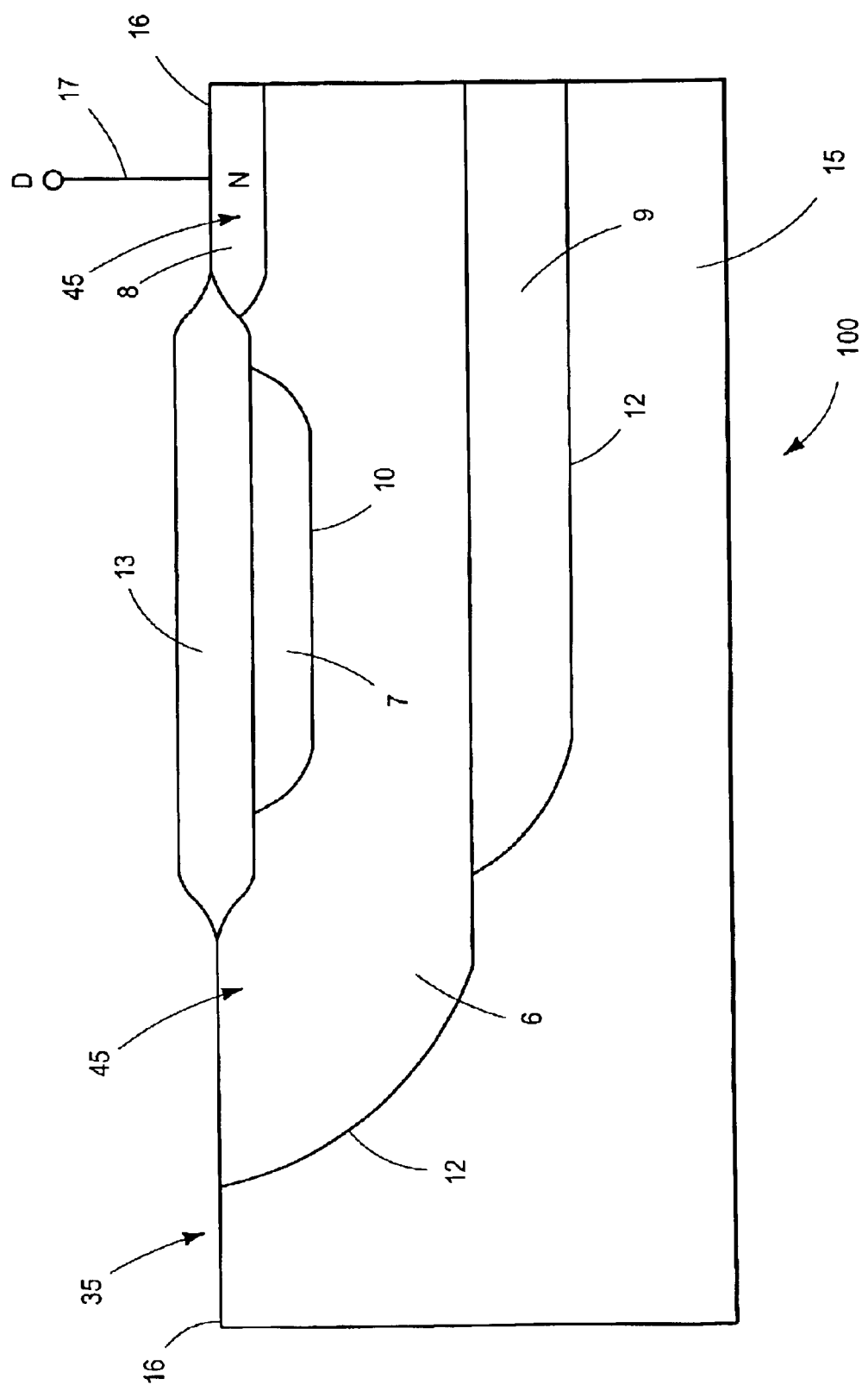
FIG. 3 is a cross-sectional view of a portion of the transistor including a termination region and a drain region.

FIG. 2 is a top-view of transistor 100 showing selected features in order to generally describe the layout, including an interdigitated source finger 26 and drain fingers 21 and 23 of region 8. The locations for cross-sectional views 1—1 and 2—2 are indicated, and those cross-sectional views are shown in FIG. 1 and FIG. 3 respectively.

The source finger 26 includes a device portion 27 and a termination region 35. The device portion 27 contains the source region 2 (not shown). The device portion 27 is bounded on each side by junction 29 and is used to couple channel sections 31 and 51 of channel 50 for conducting currents $I_1$ and $I_2$, respectively. The upper extent of the device portion 27, and therefore source region 2, is generally across from the drain tip 37 of the drain finger 21. The lower extent of the device portion 27, and therefore source region 2, generally lies across from boundary 38 of junction 12.

Termination region 35 is the shovel-shaped region adjacent to the device portion 27 extending generally from boundary 38 to the curved portion of junction 12.

The p-well region 4 is formed through the entire length of the device portion 27 and extends from the device portion 27 to the perimeter of substrate 15.

Drain fingers 21 and 23 are formed as thin, finger-shaped portions of region 8 that extend upwardly within drain region 45 as shown. Drain fingers 21 and 23 are electrically coupled by virtue of region 8 being formed as a continuous region.

Channel sections 31 and 51 of channel 50 lie along junction 29 within device portion 27 to electrically couple source region 2 and the drain region 45. From a line 47 centered within device portion 27 between the first and second currents $I_1$ and $I_2$, the first and second currents $I_1$ and $I_2$ flow respectively through channel sections 31 and 51 in opposite directions generally perpendicular with respect to the line 47. Currents $I_1$ and $I_2$ are routed along drain electrode 17 (not shown) for summing at drain bonding pads 25 to provide a high current capacity.

The source pads 24 are connected to source region 2 via metallization (not shown), and the source pads 24 are used to connect to external circuitry.

FIG. 3 shows a cross-sectional view of transistor 100 showing the p-top region 7 and the first 6 and second 9 drain portions formed in the vicinity of the termination region 35. This cross-sectional view is distinguished from the cross-sectional view illustrated in FIG. 1, because there is no p-well, source region, or channel. The termination region 35 is used to distribute the electric field, thereby increasing the breakdown voltage of the transistor 100 to produce a more robust device.

As previously mentioned, transistor 100 operates at a voltage of more than of seven hundred volts. By increasing the voltage applied to the drain electrode 17 to seven hundred volts with the source electrode 19 grounded, depletion occurs at the termination region 35 and extends outward in both directions from junctions 10 and 12. From junction 12, the depletion extends outward into substrate 15 and into the first 6 and second 9 drain portions. In addition, depletion from junction 10 extends outward into the first 6 and second 9 drain portions and into the p-top region 7. This additional depletion at junction 10 reduces the peak electric field of transistor 100, thereby contributing to a more consistently high breakdown voltage and a more robust device.

Figure 4:
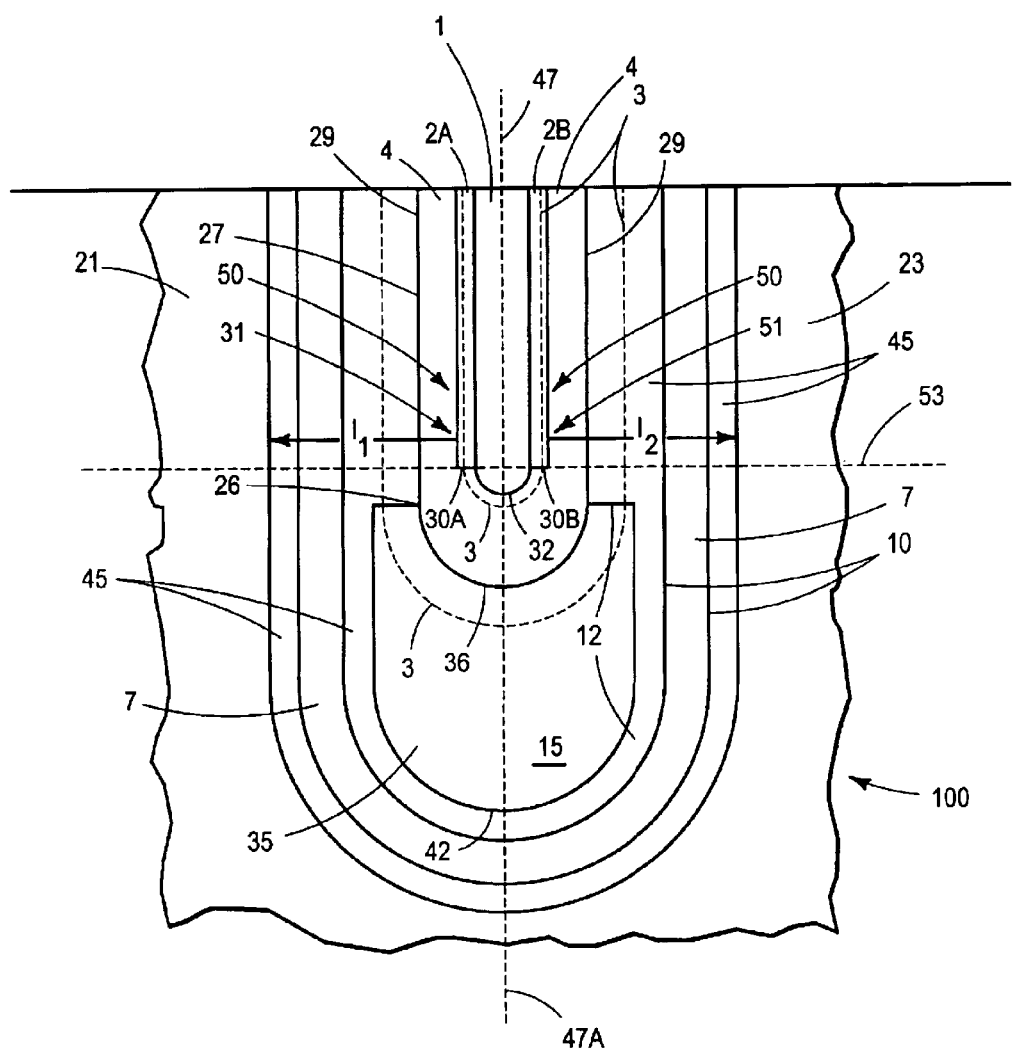
FIG. 4 is a top-view of a portion of the transistor showing source finger details.

FIG. 4 is a top-view of a portion of the transistor 100 showing details of source finger 26, including the lower extent of the device portion 27 and termination region 35, and showing the location of the p-top region 7. Note that p-top region 7 is formed continuously along the drain region 45. The drain region 45 is formed along both the device portion 27 and the termination region 35.

The p-well region 4 is formed throughout the device portion 27. In one embodiment, the lower end of the p-well region 4 has a rounded end 36.

The contact region 1 is formed along the line 47 and at the surface 16 of substrate 15 and has a rounded end 32.

Source region 2 is shown as having a generally straight structure. However, source region 2 may be formed in virtually any shape. For example, in one embodiment the source region 2 comprises two portions 2A and 2B, each lying on opposite sides of line 47. Portion 2A to the left of the line 47 has a side coupled to channel section 31 of channel 50 to conduct the current $I_1$, and portion 2B to the right of the line 47 has a side coupled to channel section 51 of channel 50 to conduct the current $I_2$. Portions 2A and 2B have ends 30A and 30B respectively that define line 53 generally parallel to the direction of currents $I_1$ and $I_2$. On the other side of the line 53 no channel 50 will form. Below the bottom ends 30A and 30B of the source region 2, there is no channel formation and or current. In one embodiment, the bottom ends 30A and 30B of the source region 2 are the edge of the source region 2 generally closest to the tip 42 of the source finger 26. In one embodiment, the device portion 27 is the channel forming portion of the source finger 26, and the termination region 35 is the non-channel forming portion of the source finger 26. In one embodiment, the source region 2 is made of a plurality of areas along the length of the p-well 4. In another embodiment, the bottom ends 30A and 30B of source region 2 are not rounded and do not extend as far as the rounded end 32 of the contact region 1. In an alternate embodiment, the bottom ends 30A and 30B are rounded.

The gate 3 is shown with dashed-lines, and in one embodiment the lower extent of the gate is rounded. In one embodiment, the width of gate 3 extends from source region 2 over channel sections 31 and 51 of channel 50 to drain region 45. In another embodiment, the gate 3 extends at least the length of the device portion 27.

The termination region 35 is formed to fully deplete when the transistor 100 reaches its maximum breakdown voltage. Termination region 35 is adjacent to the bottom ends 30A and 30B of the source region 2 and is intersected by an extension or projection 47A of the line 47. In the embodiment shown in FIG. 3, no p-well region or p-top region is formed within termination region 35.

Note that the both the portion of drain region 45 that surrounds termination region 35 and the portion adjacent to device portion 27 contain p-top region 7. Hence, p-top region 7 is formed in directions both parallel and perpendicular to the direction of currents $I_1$ and $I_2$. That is, p-top region 7 is formed within the area of drain region 45 lying adjacent to channel sections 51 and 31 of channel 50, and also within the portion of drain region 45 that surrounds termination region 35. Hence, a portion of p-top region 7 intersects projection 47A of line 47 and another portion is formed generally perpendicular to line 47. For example, the portion of p-top region 7 formed nearly perpendicular to the direction of currents $I_1$ and $I_2$ is generally below the tip 42 of the source finger 26.

This arrangement results in p-top region 7 being formed as a continuous region, thereby allowing termination region 35 to be reduced in area to reduce the manufacturing cost of transistor 100 without sacrificing its breakdown voltage or increasing its on-state resistance.

The formation of the p-top region 7 within the drain region 45 reduces the degradation of the breakdown voltage and improves reliability by forming the drain region 45 along the termination region 35 with the p-top region 7 formed in a continuous fashion within the drain region 45.

Figure 5:
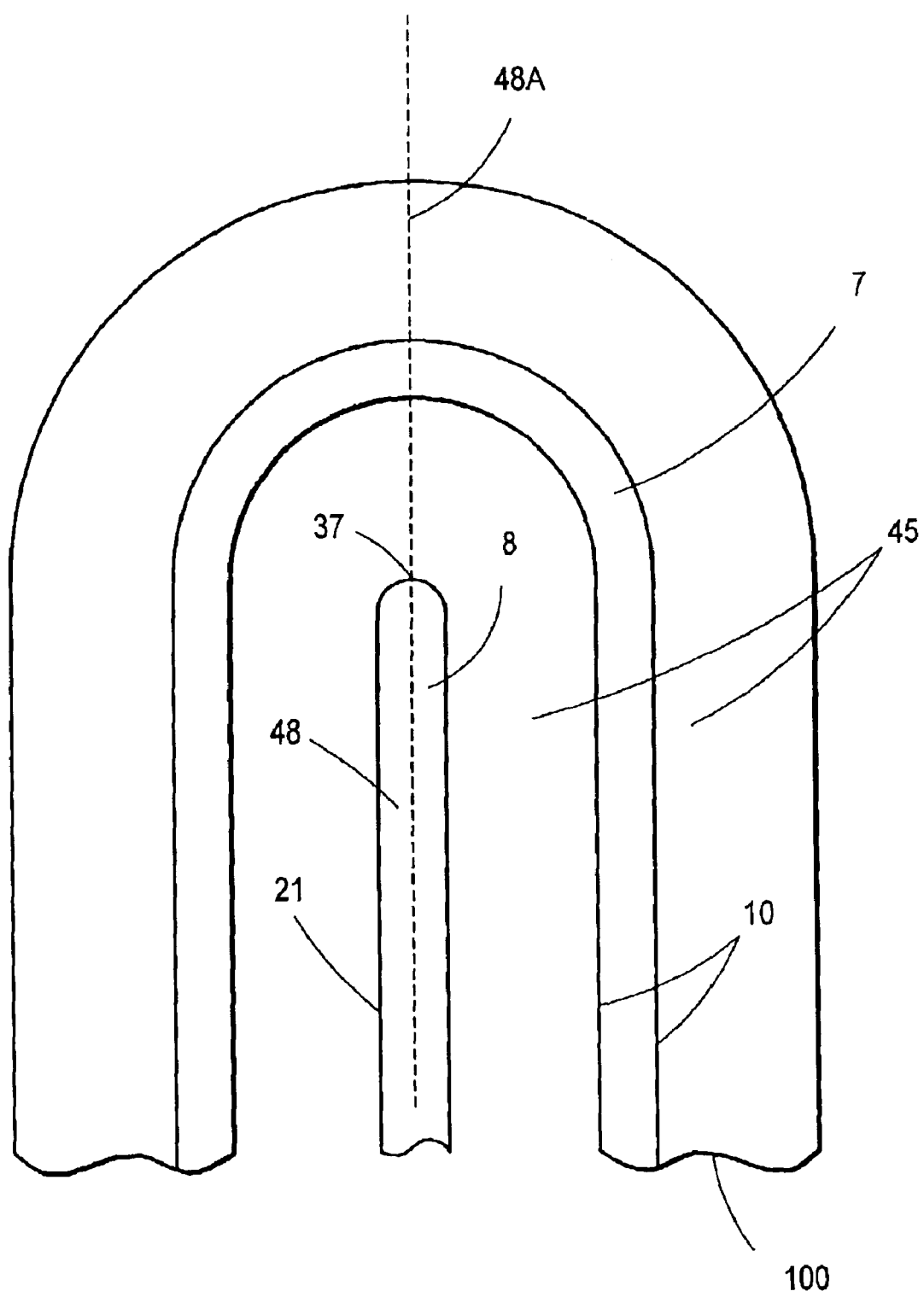
FIG. 5 is a top-view of a portion of the transistor showing drain finger details.

FIG. 5 is a top-view of a portion of the transistor 100 showing selected details in the vicinity of the drain tip 37 at the end of the drain finger 21, and including the p-top region 7.

In one embodiment, the drain finger 21 forms along a centerline 48, and a projection 48A of the centerline 48 intersects the p-top region 7 or field reduction region. The junction 10 is formed between the drain region 45 and the p-top region 7. Depletion from junction 10 in the vicinity of the drain tip 37 of the drain finger 21 provides for a higher breakdown voltage at the drain tip 37 and overcomes the problem of premature breakdown.

In summary, the present invention provides a LDMOS transistor formed on a substrate with a surface for forming first and second channels. A source region is formed at the surface and along a line centered between the first and second channels. A drain region is formed at the surface and is electrically coupled to the source region through the first and second channels. In addition, a field reduction region is formed within the drain region and intersects a projection of the line.

What is claimed is:

1. A transistor, comprising:
   a substrate having a first conductivity type and a surface;
   a well region of the first conductivity type formed in the surface, wherein the well region has a higher dopant concentration than the substrate, the well region for forming first and second channels;
   a source region of a second conductivity type formed in the well region and along a line centered between the first and second channels;
   a drain region of the second conductivity type formed at the surface, wherein a portion of the drain region and the well region overlap, and wherein the drain region is electrically coupled to the source region through the first and second channels; and
   a field reduction region formed within the drain region and intersecting a projection of the line.

2. The transistor of claim 1, wherein the drain region is extended around a termination region of the substrate, wherein the termination region is adjacent to the source region and intersects the projection of the line.

3. The transistor of claim 2 further comprising a junction formed between the termination region and the drain region, wherein a portion of the junction is curved.

4. The transistor of claim 1, further comprising a contact region of the first conductivity type formed in the well region and along the line.

5. The transistor of claim 4, wherein the contact portion has a rounded end, and wherein the source region does not extend as far as the rounded end.

6. The transistor of claim 1, wherein the field reduction region comprises the first conductivity type.

7. The transistor of claim 1, wherein the source region comprises a first portion and a second portion, wherein the first and second portion lie on opposite sides of the line, and wherein the first portion has a first end and the second portion has a second end, and wherein the first and second ends terminate on a second line generally parallel to current flow.

8. The transistor of claim 1, wherein the first conductivity is p-type.

9. The transistor of claim 1, further comprising a gate for controlling the first and second channels.

10. The transistor of claim 1, wherein the source region and the drain region are interdigitated.

11. The transistor of claim 1, wherein the drain region further comprises a drain finger formed at the surface and along a line; wherein a projection of the line intersects the field reduction region.

12. A high voltage transistor comprising:
    a substrate having a first conductivity type and a surface;
    a well region of the first conductivity type formed the surface for forming a channel;
    a drain formed at the surface for conducting a channel current flowing through the channel, wherein the drain has a second conductivity type, and wherein at least a portion of the drain forms a junction with the well region; and
    a field reduction region formed within the drain and in a direction generally perpendicular to a direction of the channel current.

13. The transistor of claim 12 further comprising a source formed in the well region for conducting the channel current.

14. The transistor of claim 13, further comprising a contact region formed in the well region, wherein the contact region has a rounded end, and wherein the source region comprises a first portion and a second portion on opposite sides of the contact region, and wherein the first portion has a first end, and wherein the second portion has a second end, and wherein the first and second ends terminate on a line generally parallel to the direction of the channel current.

15. The transistor of claim 12, wherein the source and drain are interdigitated.

16. The transistor of claim 12, further comprises a gate for controlling the first and second channels.

17. The transistor of claim 12, wherein the field reduction region is formed continuously along the drain.

* * * * *